(12) United States Patent
Liu (10) Patent No.: US 11,894,363 B2
(45) Date of Patent: Feb. 6, 2024

(54) SEMICONDUCTOR DEVICE WITH A DOPED WELL REGION (71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 148 days.

(21) Appl. No.: 17/443,505

(22) Filed: Jul. 27, 2021

(65) Prior Publication Data
US 2021/0358905 A1 Nov. 18, 2021

Related U.S. Application Data

(63) Continuation of application No. PCT/CN2021/079974, filed on Mar. 10, 2021.

(30) Foreign Application Priority Data

Apr. 3, 2020 (CN) .......................... 202010259542.6

(51) Int. Cl.
*H01L 27/02* (2006.01)
*H01L 29/74* (2006.01)

(52) U.S. Cl.
CPC ...... *H01L 27/0262* (2013.01); *H01L 29/7436* (2013.01)

(58) Field of Classification Search
CPC . H01L 29/7436; H01L 29/0692; H01L 27/02; H01L 29/87; H01L 29/0603;
(Continued)

(56) References Cited

U.S. PATENT DOCUMENTS

| 9,130,008 B2 | 9/2015 | Lin |
| 2009/0206367 A1 | 8/2009 | Gauthier, Jr. |
| 2015/0187749 A1* | 7/2015 | Dai ..................... H01L 29/7436 257/173 |

FOREIGN PATENT DOCUMENTS

| CN | 1377084 A | 10/2002 |
| CN | 102315258 A | 1/2012 |

(Continued)

OTHER PUBLICATIONS

International Search Report in the international application No. PCT/CN2021/079974, dated May 26, 2021.

(Continued)

*Primary Examiner* — Wasiul Haider
(74) *Attorney, Agent, or Firm* — Syncoda LLC; Feng Ma (57) ABSTRACT

A semiconductor device includes: a doped well region of a first conductive type; M semiconductor components, the M semiconductor components being provided in the doped well region of the first conductive type and being arranged in the doped well region of the first conductive type in a first direction, M being a positive integer, each semiconductor component including a first doped region of a second conductive type and a doped region of a first conductive type, and the doped region of the first conductive type surrounding the first doped region of the second conductive type; and second doped regions of a second conductive type, the second doped regions of the second conductive type being provided on at least one side of the M semiconductor components in the first direction.

8 Claims, 10 Drawing Sheets

(58) Field of Classification Search
CPC ............. H01L 29/0684; H01L 27/0817; H01L 27/0262; H01L 2924/13034; H01L 29/0649; H01L 29/66121
See application file for complete search history.

(56) References Cited

FOREIGN PATENT DOCUMENTS

| | | | |
|---|---|---|---|
| CN | 104600069 A | | 5/2015 |
| CN | 106920792 A | | 7/2017 |
| CN | 107275324 A | | 10/2017 |
| CN | 108305873 | * | 7/2018 |
| CN | 108389891 B | | 3/2019 |
| CN | 110867482 A | | 3/2020 |

OTHER PUBLICATIONS

Second Office Action of the Chinese application No. 202010259542.6, dated Nov. 9, 2023. 7 pages with English abstract.

* cited by examiner

SEMICONDUCTOR DEVICE WITH A DOPED WELL REGION

CROSS-REFERENCE TO RELATED APPLICATIONS

This is a continuation of International Patent Application No. PCT/CN2021/079974 filed on Mar. 10, 2021, which claims priority to Chinese Patent Application No. 202010259542.6 filed on Apr. 3, 2020. The disclosures of these applications are hereby incorporated by reference in their entirety.

BACKGROUND

Electrostatic Discharge (ESD) refers to transfer of charges caused by mutual contact of two objects with different charges. As the size of a semiconductor process continues to shrink and the application environment is increasingly complex, chips are increasingly threatened by Electrostatic Discharge (ESD) damage. The transient current in the electrostatic discharge process can reach several amperes or even tens of amperes. It is easy to cause the permanent failure of the chip in case of insufficient corresponding ESD protection measures.

SUMMARY

The present disclosure relates to the technical field of semiconductors, and more specifically to a semiconductor device.

According to various embodiments of the present disclosure, there is provided a semiconductor device.

The present disclosure provides a semiconductor device, which includes:
  a doped well region of a first conductive type;
  M semiconductor components, the M semiconductor components being provided in the doped well region of the first conductive type and being arranged in the doped well region of the first conductive type in a first direction, M being a positive integer, each semiconductor component including a first doped region of a second conductive type and a doped region of a first conductive type, and the doped region of the first conductive type surrounding the first doped region of the second conductive type; and
  second doped regions of a second conductive type, the second doped regions of the second conductive type being provided on at least one side of the M semiconductor components in the first direction, and the second doped regions of the second conductive type being spaced apart from an edge of the doped well region of the first conductive type by a fixed distance in a second direction, the first direction being perpendicular to the second direction.

In one of the embodiments, the M semiconductor components are arranged in multiple columns spaced apart from each other in the doped well region of the first conductive type in the first direction.

In one of the embodiments, the first doped region of the second conductive type is spaced apart from the doped region of the first conductive type by a distance.

In one of the embodiments, each of the second doped regions of the second conductive type is an elongated structure extending in the first direction, and a length of each second doped region of the second conductive type is greater than a distance between two semiconductor components at both ends.

In one of the embodiments, the second doped regions of the second conductive type are a plurality of strip-like structures spaced apart from each other in the first direction, and each of the plurality of strip-like structures is arranged corresponding to a respective one of the semiconductor components.

In one of the embodiments, the second doped regions of the second conductive type are a plurality of strip-like structures spaced apart from each other along a circumference of the entire M semiconductor components, and each of the second doped regions of the second conductive type is arranged corresponding to a respective one of the semiconductor components.

In one of the embodiments, a width of the first doped region of the second conductive type is comprised between 0.1 μm and 10 μm.

In one of the embodiments, a width of each second doped region of the second conductive type is comprised between 0.01 μm and 5 μm.

In one of the embodiments, the first conductive type is an N type, and the second conductive type is a P type; or the first conductive type is a P type, and the second conductive type is an N type.

The present disclosure further provides a semiconductor device, which includes:
  a doped well region of a first conductive type;
  M first semiconductor components, the M first semiconductor components being provided in the doped well region of the first conductive type and being arranged in the doped well region of the first conductive type in a first direction, M being a positive integer, each first semiconductor component including a first doped region of a second conductive type and a first doped region of a first conductive type, and the first doped region of the first conductive type surrounding the first doped region of the second conductive type;
  second doped regions of a second conductive type, the second doped regions of the second conductive type being provided on at least one side of the M first semiconductor components in the first direction, and the second doped regions of the second conductive type being spaced apart from an edge of the doped well region of the first conductive type by a first fixed distance in a second direction, the first direction being perpendicular to the second direction;
  a doped well region of a second conductive type, the doped well region of the second conductive type is provided on one side of the doped well region of the first conductive type in the second direction and is arranged adjacent to the doped well region of the first conductive type;
  M second semiconductor components, the M second semiconductor components being provided in the doped well region of the second conductive type and being arranged in the doped well region of the second conductive type in the second direction, each second semiconductor component including a second doped region of a first conductive type and a third doped region of a second conductive type, and the third doped region of the second conductive type surrounding the second doped region of the first conductive type; and
  third doped regions of a first conductive type, the third doped regions of the first conductive type being provided on at least one side of the M second semiconductor components in the first direction, the third doped regions of the first conductive type being spaced apart from the doped well region of the second conductive type by a second fixed distance in the second direction.

In one of the embodiments, the M first semiconductor components are arranged in multiple columns spaced apart from each other in the doped well region of the first conductive type in the first direction, and the M second semiconductor components are arranged in multiple columns spaced apart from each other in the doped well region of the second conductive type in the first direction.

In one of the embodiments, each of the second doped regions of the second conductive type is an elongated structure extending in the first direction, and a length of each second doped region of the second conductive type is greater than a distance between two first semiconductor components at both ends.

Each of the third doped regions of the first conductive type is an elongated structure extending in the first direction, and a length of each third doped region of the first conductive type is greater than a distance between two second semiconductor components at both ends.

In one of the embodiments, the second doped regions of the second conductive type are a plurality of strip-like structures spaced apart from each other in the first direction, and each of the plurality of strip-like structures is arranged corresponding to a respective one of the first semiconductor components.

The third doped regions of the first conductive type are a plurality of strip-like structures spaced apart from each other in the first direction, and each of the plurality of strip-like structures is arranged corresponding to a respective one of the second semiconductor components.

In one of the embodiments, the second doped regions of the second conductive type are a plurality of strip-like structures spaced apart from each other along a circumference of the entire M first semiconductor components, and each of the second doped regions of the second conductive type is arranged corresponding to a respective one of the first semiconductor components.

The third doped regions of the first conductive type are a plurality of strip-like structures spaced apart from each other along a circumference of the entire M second semiconductor components, and each of the third doped regions of the first conductive type is arranged corresponding to a respective one of the second semiconductor components.

In one of the embodiments, each of a width of the first doped region of the second conductive type and a width of the second doped region of the first conductive type is comprised between 0.1 µm and 10 µm.

Each of a width of each second doped region of the second conductive type and a width of each third doped region of the first conductive type is comprised between 0.01 µm and 5 µm.

The present disclosure has the beneficial effects as follows.

The second doped regions of the second conductive type allow an edge of the entire M semiconductor components to be formed as a region with a low turn-on voltage and a high sustain current to obtain a better electrostatic discharge performance, so that the electrostatic discharge performance of the semiconductor device cannot be affected even if the overall area of the semiconductor device is reduced.

A Silicon Controlled Rectifier (SCR) is formed between the doped well region of the first conductive type and the doped well region of the second conductive type adjacent to each other. The SCR has good electrostatic discharge protection characteristics and a relatively small device area, which allows the edge of the entire M semiconductor components to be formed as a region with a low turn-on voltage and a high sustain current to obtain a better electrostatic discharge performance, so that the semiconductor device as a whole still has strong electrostatic discharge capability while having a smaller area.

BRIEF DESCRIPTION OF THE DRAWINGS

Through a more detailed description of the preferred embodiments of the present disclosure shown in the drawings, the above and other purposes, features and advantages of the present disclosure will become clearer. In all drawings, the same reference numerals indicate the same parts. The drawings are not intentionally scaled in proportion to an actual size, and the emphasis is on showing spirit of the present disclosure.

DETAILED DESCRIPTION

In order to make the above-mentioned purposes, features and advantages of the present disclosure more apparent and understandable, the specific implementations of the present disclosure will be described in detail below with reference to the accompanying drawings. Many specific details are set forth in the following description in order to fully understand the present application. However, the present disclosure can be implemented in many other ways different from those described herein, and those skilled in the art can make similar improvements without departing from the conception of the present disclosure. Therefore, the present disclosure is not limited by specific implementations disclosed below.

Unless defined otherwise, all technical and scientific terms used herein have the same meaning as commonly understood by those skilled in the art to which the present disclosure belongs. The terminology used in the specification of the present disclosure is for a purpose of describing specific embodiments only and is not intended to limit the present disclosure. The term "and/or" used herein includes any and all combinations of one or more of the associated listed items.

In the description of the present disclosure, it should be noted that terminologies of "upper", "lower", "vertical", "horizontal", "inner", "outer" and the like that indicate relations of directions or positions are based on the relations of directions or positions shown in the drawings, which are only to facilitate description of the present disclosure and to simplify the description of the present disclosure, rather than to indicate or imply that the referred device or element is limited to the specific direction or to be operated or configured in the specific direction. Therefore, the above-mentioned terminologies shall not be interpreted as confine to the present disclosure.

Figure 1:
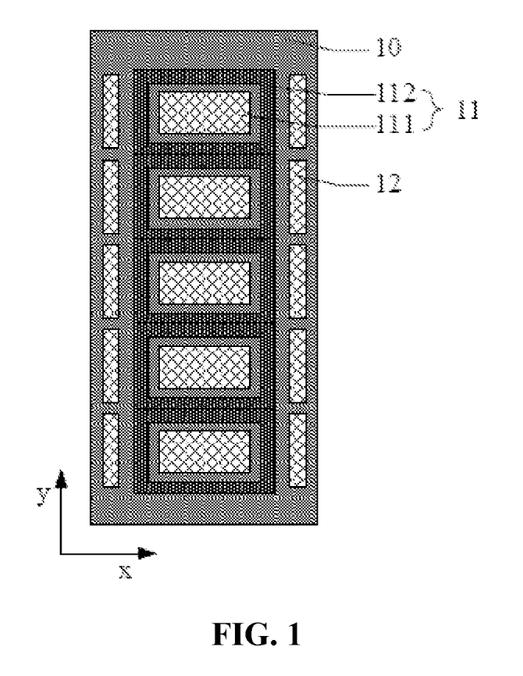
FIG. 1 is a schematic diagram of a semiconductor device according to an embodiment of the present disclosure.

In order to maintain a relatively good electrostatic discharge effect after the area of the semiconductor device is reduced, as shown in FIG. 1, a semiconductor device is provided in the present disclosure. The semiconductor device includes a substrate. The substrate may be a semiconductor substrate, such as a single crystal silicon substrate, a single crystal germanium substrate, etc. A doped well region of a first conductive type 10 is formed on the substrate. M semiconductor components 11 are formed in the doped well region of the first conductive type 10, in which M is a positive integer. The M semiconductor components 11 are arranged in a column in the doped well region of the first conductive type 10 in a first direction. The y direction shown in FIG. 1 and all the following figures is the first direction. Each semiconductor component 11 includes a first doped region of a second conductive type 111 and a doped region of a first conductive type 112, and the doped region of the first conductive type 112 surrounds the first doped region of the second conductive type 111. In one of the embodiments, a width of the first doped region of the second conductive type 111 is comprised between 0.1 µm and 10 µm, which may be 0.1 µm, 5 µm, or 10 µm. In a specific example, the width of the first doped region of the second conductive type 111 is not limited to the above-mentioned data. In one optional embodiment, the first doped region of the second conductive type 111 is of a rectangular shape, and the doped region of the first conductive type 112 is configured as a rectangular ring surrounding the first doped region of the second conductive type 111.

In one example, second doped regions of a second conductive type 12 are also formed in the doped well region of the first conductive type 10. The second doped regions of the second conductive type 12 may be provided on one side of the M semiconductor components 11 in the first direction, or may be provided on both sides of the M semiconductor components 11 in the first direction. Moreover, the second doped regions of the second conductive type 12 are spaced apart from an edge of the doped well region of the first conductive type 10 by a fixed distance in a second direction. The x direction shown in FIG. 1 and all the following figures is the second direction. The first direction is perpendicular to the second direction. In one optional embodiment, a width of each of the second doped regions of the second conductive type 12 is comprised between 0.01 µm and 5 µm, which may be 0.01 µm, 3 µm, or 5 µm. However, the above-mentioned data is only an example. In a practical embodiment, the width of each of the second doped regions of the second conductive type 12 is not limited to the above-mentioned data.

As shown in FIG. 1, in one optional embodiment, the second doped regions of the second conductive type 12 are a plurality of strip-like structures spaced apart from each other in the first direction. A length of each strip-like structure in the first direction is less than a length of each semiconductor component 11 in the first direction, and each strip-like structure is arranged corresponding to a respective one of the semiconductor components 11.

Figure 2:
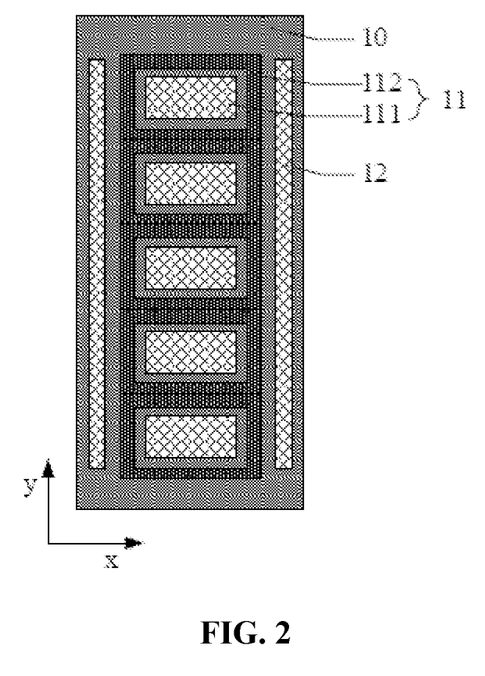
FIG. 2 is a schematic diagram of a semiconductor device according to another embodiment of the present disclosure.

As shown in FIG. 2, in one optional embodiment, each of the second doped regions of the second conductive type 12 is an elongated structure extending in the first direction, and a length of each second doped region of the second conductive type 12 is greater than a distance between two semiconductor components 11 at both ends in the first direction. That is, each second doped region of the second conductive type 12 extends across all the semiconductor components 11 in the first direction.

Figure 3:
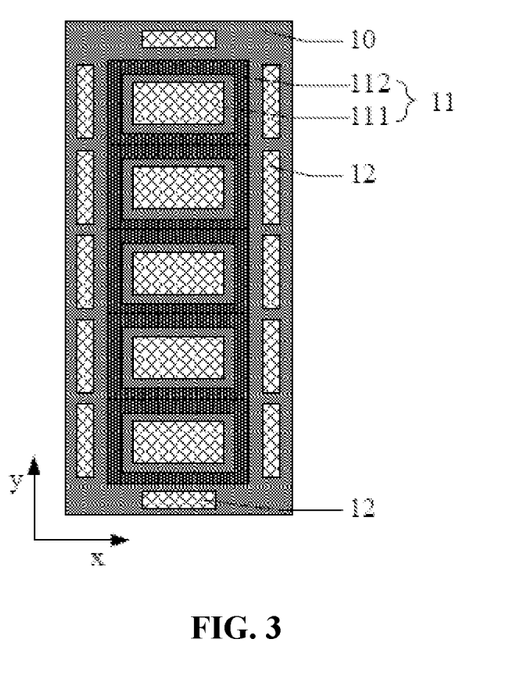
FIG. 3 is a schematic diagram of a semiconductor device according to yet another embodiment of the present disclosure.

As shown in FIG. 3, in other optional embodiments, the second doped regions of the second conductive type 12 are a plurality of strip-like structures spaced apart from each other along a circumference of the entire M semiconductor components 11, and each of the second doped regions of the second conductive type 12 is arranged corresponding to a respective one of the semiconductor components 11. That is, in addition to being provided on two opposite sides of the M semiconductor components 11 arranged in one column in the first direction, the second doped regions of the second conductive type 12 are also provided on both ends of the semiconductor components, which means that the second doped regions of the second conductive type 12 are also provided on both ends of the M semiconductor components 11 in the first direction.

Figure 4:
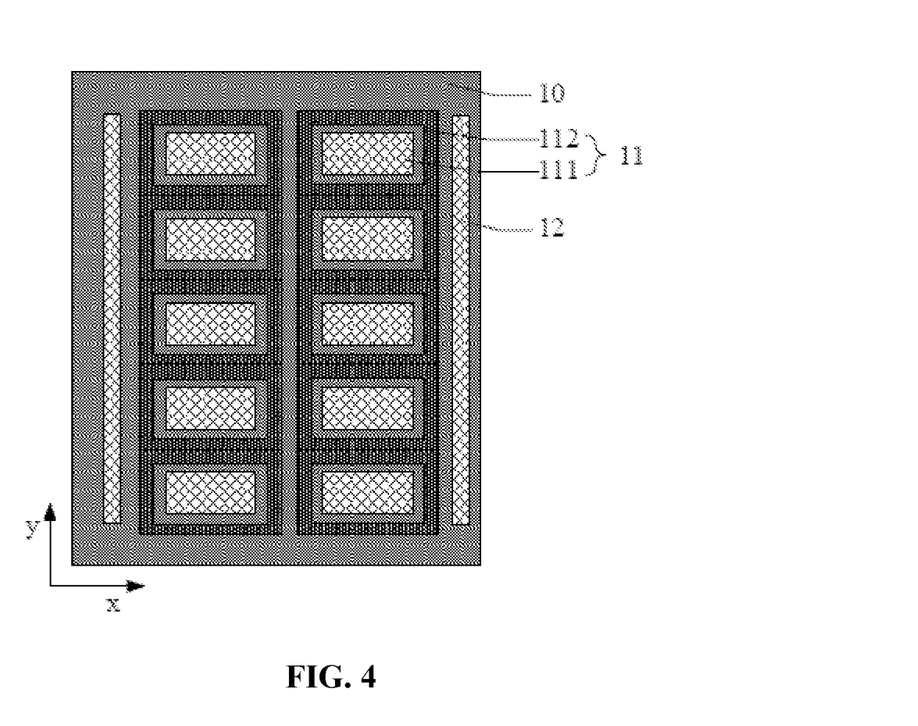
FIG. 4 is a schematic diagram of a semiconductor device with semiconductor components arranged in multiple columns according to an embodiment of the present disclosure.

As shown in FIG. 4, in one optional embodiment, the M semiconductor components 11 are arranged in multiple columns in the first direction in the doped well region of the first conductive type 10. In this case, the second doped regions of the second conductive type 12 are provided on one side or both sides of the entire M semiconductor components 11 arranged in multiple columns. It should be noted that the number of columns in which the M semiconductor components 11 are arranged in the doped well region of the first conductive type 10 may be set according to actual needs, which may be two columns, three columns, four columns, five columns and even more columns. In FIG. 4, as an example, the M semiconductor components 11 are only arranged in two columns in the first direction in the doped well region of the first conductive type 10. In a practical example, the number of columns in which the M semiconductor components 11 are arranged in the doped well region of the first conductive type 10 is not limited thereto.

In one optional embodiment, the first doped region of the second conductive type 111 is spaced apart from the doped region of the first conductive type 112 by a distance, so that they are not in direct contact with each other.

In one optional embodiment, the first conductive type is an N type, and the second conductive type is a P type. That is, a doped well region of an N type is formed on the substrate. Specifically, the doped well region of the N type may be formed on the substrate by means of ion implantation. Each semiconductor component 11 includes a first doped region of a P type and a doped region of an N type. The doped region of the N type surrounds the first doped region of the P type, and each second doped region of the second conductive type 12 is a second doped region of a P type.

In another optional embodiment, the first conductive type is a P type, and the second conductive type is an N type. That is, a doped well region of a P type is formed on the substrate. Specifically, the doped well region of the P type may be formed on the substrate by means of ion implantation. Each semiconductor component 11 includes a first doped region of an N type and a doped region of a P type. The doped region of the P type surrounds the first doped region of the N type, and each second doped region of the second conductive type 12 is a second doped region of an N type.

Figure 5:
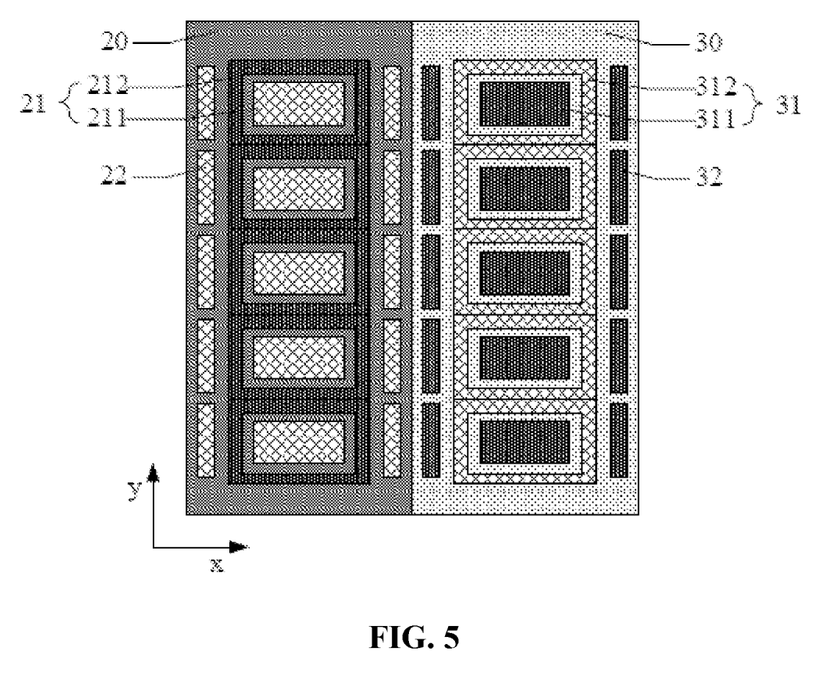
FIG. 5 is a schematic diagram of a semiconductor structure which includes a doped well region of a first conductive type and a doped well region of a second conductive type according to an embodiment of the present disclosure.

As shown in FIG. 5, the present disclosure further provides a semiconductor device. The semiconductor device includes: a doped well region of a first conductive type 20; M first semiconductor components 21, the M first semiconductor components 21 being provided in the doped well region of the first conductive type 20 and being arranged in the doped well region of the first conductive type 20 in a first direction, M being a positive integer, each first semiconductor component 21 including a first doped region of a second conductive type 211 and a first doped region of a first conductive type 212, and the first doped region of the first conductive type 212 surrounding the first doped region of the second conductive type 211; second doped regions of a second conductive type 22, the second doped regions of the second conductive type 22 being provided on at least one side of the M first semiconductor components 21 in the first direction, the second doped regions of the second conductive type 22 being spaced apart from an edge of the doped well region of the first conductive type 20 by a first fixed distance in a second direction, and the first direction being perpendicular to the second direction; a doped well region of a second conductive type 30, the doped well region of the second conductive type being provided on one side of the doped well region of the first conductive type 20 in the second direction and being arranged adjacent to the doped well region of the first conductive type 20; M second semiconductor components 31, the M second semiconductor components 31 being provided in the doped well region of the second conductive type 30 and being arranged in the doped well region of the second conductive type 30 in the second direction, each second semiconductor component 31 including a second doped region of a first conductive type 311 and a third doped region of a second conductive type 312, and the third doped region of the second conductive type 312 surrounding the second doped region of the first conductive type 311; and third doped regions of a first conductive type 32, the third doped regions of the first conductive type 32 being provided on at least one side of the M second semiconductor components 31 in the first direction, the third doped regions of the first conductive type 32 being spaced apart from the doped well region of the second conductive type 30 by a second fixed distance in the second direction.

In one example, the semiconductor device further includes a substrate. The substrate may be a semiconductor substrate, such as a single crystal silicon substrate, a single crystal germanium substrate, etc. The doped well region of the first conductive type 20 and the doped well region of the second conductive type 22 are both provided in the substrate.

In one of the embodiments, a width of the first doped region of the second conductive type 211 is comprised between 0.1 μm and 10 μm, which may be 0.1 μm, 5 μm, or 10 μm. However, the above-mentioned data is only an example. In a practical embodiment, the width of the first doped region of the second conductive type 211 is not limited to the above-mentioned data. In one optional embodiment, the first doped region of the second conductive type 211 is of a rectangular shape, and the first doped region of the first conductive type 212 is configured as a rectangular ring surrounding the first doped region of the second conductive type 211.

In one optional embodiment, a width of each second doped region of the second conductive type 22 is comprised between 0.01 μm and 5 μm, which may be 0.01 μm, 3 μm, or 5 μm. However, the above-mentioned data is only an example. In a practical embodiment, the width of each second doped region of the second conductive type 22 is not limited to the above-mentioned data.

In one of the embodiments, a width of the second doped region of the first conductive type 311 is comprised between 0.1 μm and 10 μm, which may be 0.1 μm, 5 μm, or 10 μm. However, the above-mentioned data is only an example. In a practical embodiment, the width of the second doped region of the first conductive type 311 is not limited to the above-mentioned data. In one optional embodiment, the second doped region of the first conductive type 311 is of a rectangular shape, and the third doped region of the second conductive type 312 is configured as a rectangular ring surrounding the second doped region of the first conductive type 311.

In one optional embodiment, a width of each third doped region of the first conductive type 32 is comprised between 0.01 μm and 5 μm, which may be 0.01 μm, 3 μm, or 5 μm. However, the above-mentioned data is only an example. In a practical embodiment, the width of each third doped region of the first conductive type 32 is not limited to the above-mentioned data.

In one optional embodiment, an distance between one of the second doped regions of the second conductive type 22 and the adjacent third doped region of the first conductive type 32 which are provided between the first semiconductor components 21 and the second semiconductor components 31 is comprised between 1 μm and 20 μm, which may be 1 μm, 10 μm, or 20 μm. However, the above-mentioned data is only an example. In a practical embodiment, the distance between one of the second doped regions of the second conductive type 22 and the adjacent third doped region of the first conductive type 32 which are provided between the first semiconductor components 21 and the second semiconductor components 31 is not limited to the above-mentioned data.

As shown in FIG. 5, in one optional embodiment, the second doped regions of the second conductive type 22 are a plurality of strip-like structures spaced apart from each other in the first direction. A length of each strip-like structure in the first direction is less than a length of each first semiconductor component 21 in the first direction, and each strip-like structure is arranged corresponding to a respective one of the first semiconductor components 21. The third doped regions of the first conductive type 32 are a plurality of strip-like structures spaced apart from each other in the first direction. A length of each strip-like structure in the first direction is less than a length of each second semiconductor component 31 in the first direction, and each strip-like structure is arranged corresponding to a respective one of second semiconductor components 31.

Figure 6:
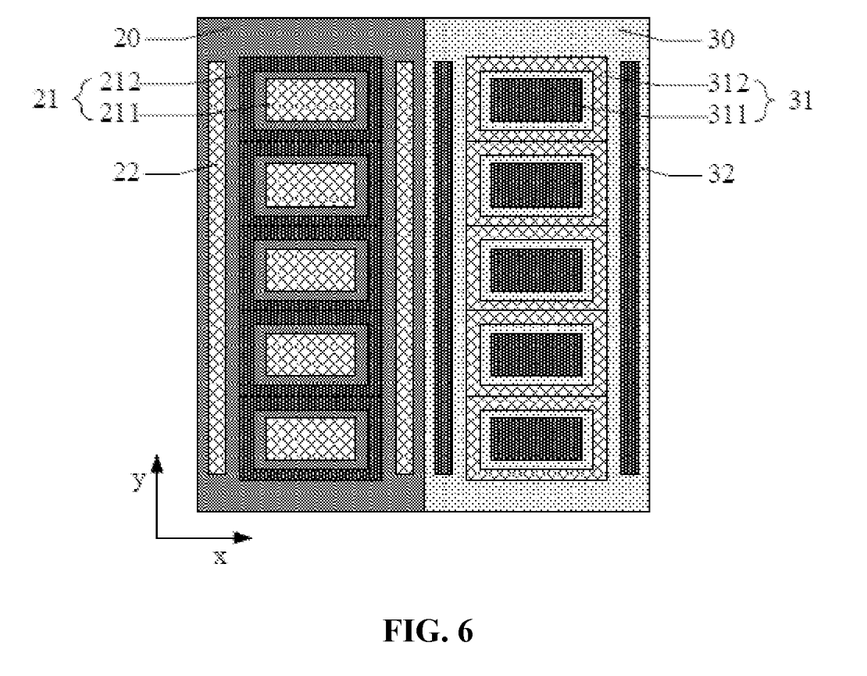
FIG. 6 is a schematic diagram of a semiconductor structure which includes a doped well region of a first conductive type and a doped well region of a second conductive type according to another embodiment of the present disclosure.

As shown in FIG. 6, in one optional embodiment, each of the second doped regions of the second conductive type 22 is an elongated structure extending in the first direction, and a length of each second doped region of the second conductive type 22 is greater than a distance between two first semiconductor components 21 at both ends in the first direction. That is, each second doped region of the second conductive type 22 extends across all the first semiconductor components 21 in the first direction. Each of the third doped regions of the first conductive type 32 is an elongated structure extending in the first direction, and a length of each third doped region of the first conductive type 32 is greater than a distance between two second semiconductor components 31 at both ends in the first direction. That is, each third doped region of the first conductive type 32 extends across all the second semiconductor components 31 in the first direction.

Figure 7:
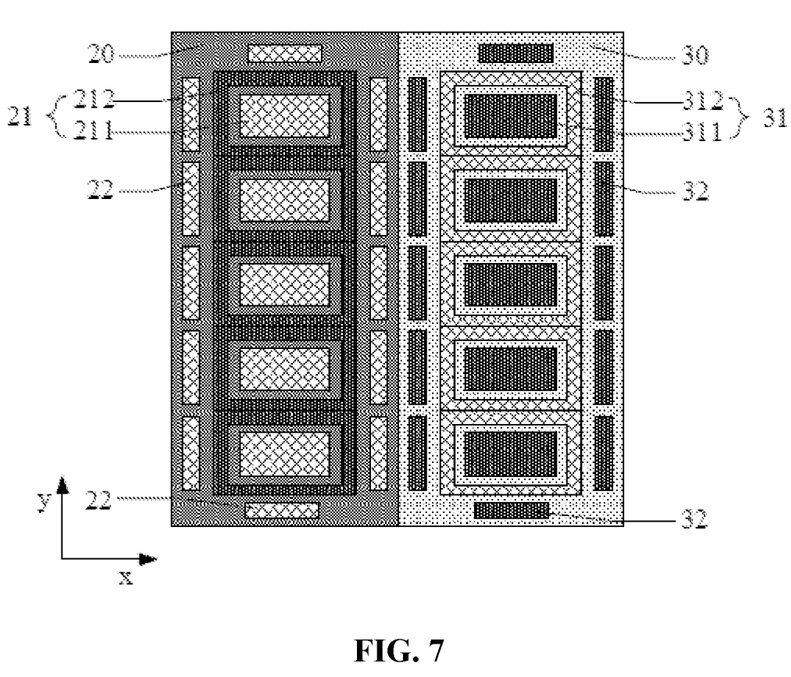
FIG. 7 is a schematic diagram of a semiconductor structure which includes a doped well region of a first conductive type and a doped well region of a second conductive type according to another embodiment of the present disclosure.

As shown in FIG. 7, in other optional embodiments, the second doped regions of the second conductive type 22 are a plurality of strip-like structures spaced apart from each other along a circumference of the entire M semiconductor components, and each of the second doped regions of the second conductive type 22 is arranged corresponding to a respective one of the semiconductor components. Therefore, the second doped regions of the second conductive type 22 are also provided at both ends of the M semiconductor components in the first direction. The third doped regions of the first conductive type 32 are a plurality of strip-like structures spaced apart from each other along a circumference of the entire M semiconductor components, and each of the third doped regions of the first conductive type 32 is arranged corresponding to a respective one of the second semiconductor components 31. Therefore, the third doped regions of the first conductive type 32 are also provided at both ends of the M second semiconductor components 31 in the first direction.

Figure 8:
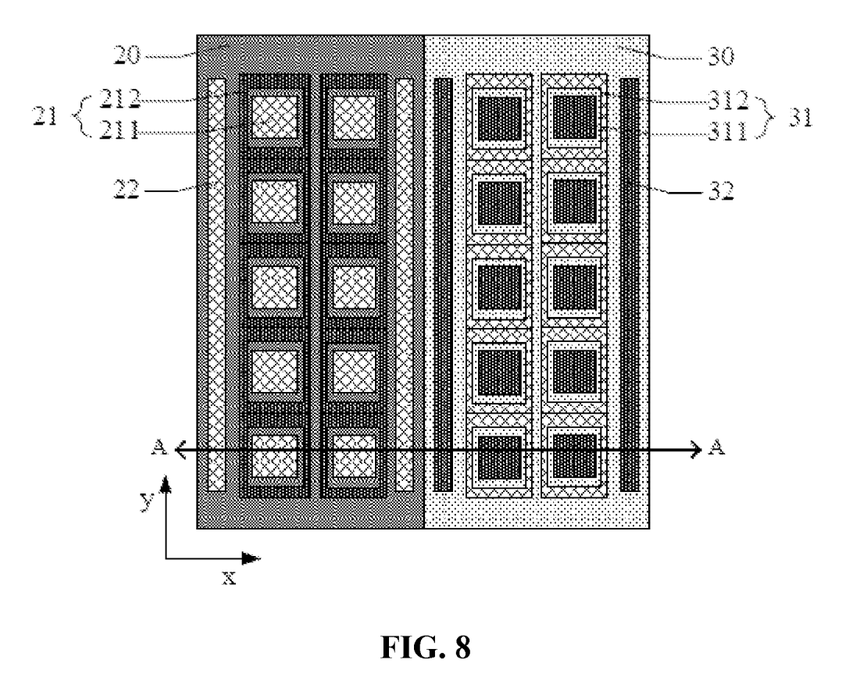
FIG. 8 is a schematic diagram of a semiconductor structure which includes a doped well region of a first conductive type and a doped well region of a second conductive type and includes first semiconductor components and second semiconductor components arranged in multiple columns according to another embodiment of the present disclosure.

As shown in FIG. 8, in one optional embodiment, the M first semiconductor components 21 are arranged in multiple columns in the doped well region of the first conductive type 20 in the first direction. In this case, the second doped regions of the second conductive type 22 are provided on one side of the entire M semiconductor components arranged in multiple columns, or may be provided on both sides of the entire M semiconductor components arranged in multiple columns. The M second semiconductor components 31 are arranged in multiple columns in the doped well region of the first conductive type 20 in the first direction. In this case, the third doped regions of the first conductive type 32 are provided on one side or both sides of the entire M second semiconductor components 31 arranged in multiple columns.

It should be noted that the number of columns in which the M semiconductor components 11 are arranged in the doped well region of the first conductive type 10 may be set according to actual needs, which may be two columns, three columns, four columns, five columns and even more columns. In FIG. 4, as an example, the M semiconductor components 11 are only arranged in two columns in the doped well region of the first conductive type 10 in the first direction. In a practical example, the number of columns in which the M semiconductor components 11 are arranged in the doped well region of the first conductive type 10 is not limited thereto.

In one optional embodiment, the first conductive type is an N type, and the second conductive type is a P type. In another optional embodiment, the first conductive type is a P type, and the second conductive type is an N type.

Figure 9:
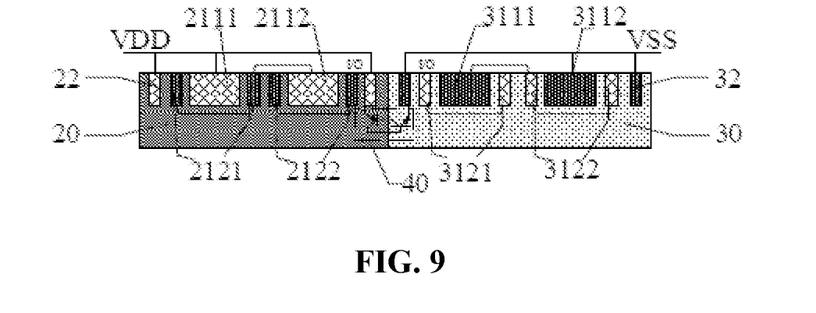
FIG. 9 is a schematic sectional diagram of the semiconductor device in FIG. 8.
Figure 10:
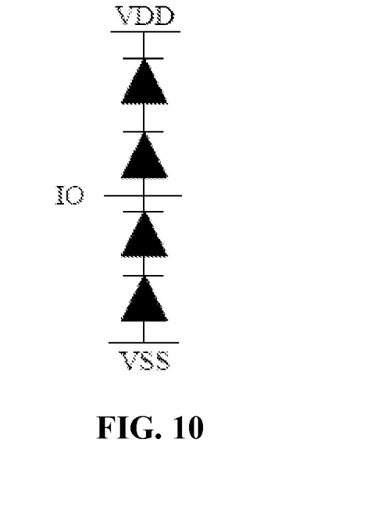
FIG. 10 is an equivalent circuit diagram of a semiconductor device according to an embodiment of the present disclosure.

Taking FIG. 9 and FIG. 10 as an example, an optional ESD protection structure is provided. As shown in FIG. 9, FIG. 9 is a sectional view along an AA direction in FIG. 8. The first semiconductor components 21 provided in the doped well region of the first conductive type 20 are arranged in two columns. The second doped region of the second conductive type 22 of the first semiconductor component 21 which is the first one seen from the left is connected to a power line VDD, and the first doped region of the second conductive type 2111 of the first semiconductor component 21 is also connected to the power line VDD, which corresponds to the cathode of the first diode seen from the top to bottom in FIG. 10. The first doped region of the first conductive type 2121 of the first semiconductor component 21 which is the first one seen from the left is connected to the first doped region of the second conductive type 2112 of the first semiconductor component 21 which is the second one seen from the left, which respectively corresponds to the anode of the first diode and the cathode of the second diode seen from the top to bottom in FIG. 10. The first doped region of the first conductive type 2122 of the first semiconductor component 21 which is the second one seen from the left is connected to the third doped region of the second conductive type 3121 of the second semiconductor component 31 which is the second one seen from the right, which respectively corresponds to the anode of the second diode and the cathode of the third diode seen from the top to bottom in FIG. 10, i.e., at an IO connection. The second doped region of the first conduction type 3111 of the second semiconductor component 31 which is the second one seen from the right is connected to the third doped region of the second conductive type 3122 of the second semiconductor component 31 which is the first one seen from the right, which respectively corresponds to the anode of the third diode and the cathode of the fourth diode seen from the top to bottom in FIG. 10. The second doped region of the first conductive type 3112 of the second semiconductor component 31 which is the first one seen from the right is connected to a ground line VSS, which corresponds to the anode of the fourth diode seen from the top to bottom in FIG. 10. The third doped region of the first conductive type 32 of the second semiconductor component 31 is also connected to the ground line VSS. In the semiconductor structure of the present disclosure, by means of the above design, an equivalent Silicon Controlled Rectifier (SCR) 40 may be formed between the doped well region of the first conductive type 20 and the doped well region of the second conductive type 30. The Silicon Controlled Rectifier 40 has good electrostatic discharge protection characteristics and a relatively small device area, which allows the edge of the entire M semiconductor components to be formed as a region with a low turn-on voltage and a high sustain current to obtain a better electrostatic discharge performance, so that the semiconductor device as a whole still has strong electrostatic discharge capability while having a smaller area.

The technical features of the embodiments described above can be arbitrarily combined. In order to make the description simple, not all the possible combinations of the technical features in the above embodiments are completely described. However, all of the combinations of these technical features should be considered as within the scope described in the present specification as long as there is no contradiction in the combinations of these technical features.

The above embodiments merely illustrate several implementations of the present disclosure, and the description thereof is specific and detailed, but they are not constructed as limiting the patent scope of the present disclosure. It should be noted that a number of variations and improvements made by those of ordinary skill in the art without departing from the conception of the present disclosure are within the protection scope of the present disclosure. Therefore, the patent protection scope of the present disclosure should be subject to the appended claims.

The invention claimed is:

1. A semiconductor device, comprising:
a doped well region of a first conductive type;
M first semiconductor components, wherein the M first semiconductor components are provided in the doped well region of the first conductive type and are arranged in the doped well region of the first conductive type in a first direction, M being a positive integer, and wherein each first semiconductor component comprises a first doped region of a second conductive type and a first doped region of a first conductive type, and the first doped region of the first conductive type surrounds the first doped region of the second conductive type; and
second doped regions of a second conductive type, wherein the second doped regions of the second conductive type are provided on at least one side of the M first semiconductor components in the first direction, and the second doped regions of the second conductive type are spaced apart from an edge of the doped well region of the first conductive type by a fixed distance in a second direction, the first direction being perpendicular to the second direction,
wherein the second doped regions of the second conductive type are a plurality of strip-like structures spaced apart from each other in the first direction, and each of the plurality of strip-like structures is arranged corresponding to a respective one of the first semiconductor components.

2. The semiconductor device of claim 1, wherein the first doped region of the second conductive type is spaced apart from the first doped region of the first conductive type by a distance.

3. The semiconductor device of claim 2, wherein the first conductive type is an N type, and the second conductive type is a P type; or the first conductive type is a P type, and the second conductive type is an N type.

4. The semiconductor device of claim 1, wherein a width of the first doped region of the second conductive type is between 0.1 µm and 10 µm.

5. The semiconductor device of claim 1, wherein a width of each second doped region of the second conductive type is between 0.01 µm and 5 µm.

6. The semiconductor device of claim 1, wherein the first conductive type is an N type, and the second conductive type is a P type; or the first conductive type is a P type, and the second conductive type is an N type.

7. A semiconductor device, comprising:
the semiconductor device according to claim 1;
a doped well region of a second conductive type, wherein the doped well region of the second conductive type is provided on one side of the doped well region of the first conductive type in the second direction and is arranged adjacent to the doped well region of the first conductive type;
M second semiconductor components, wherein the M second semiconductor components are provided in the doped well region of the second conductive type and are arranged in the doped well region of the second conductive type in the second direction, and wherein each second semiconductor component comprises a second doped region of a first conductive type and a third doped region of a second conductive type, and the third doped region of the second conductive type surrounds the second doped region of the first conductive type; and
third doped regions of a first conductive type, wherein the third doped regions of the first conductive type are provided on at least one side of the M second semiconductor components in the first direction, and the third doped regions of the first conductive type are spaced apart from the doped well region of the second conductive type by a second fixed distance in the second direction,
wherein the third doped regions of the first conductive type are a plurality of strip-like structures spaced apart from each other in the first direction, and each of the plurality of strip-like structures is arranged corresponding to a respective one of the second semiconductor components.

8. The semiconductor device of claim 7, wherein each of a width of the first doped region of the second conductive type and a width of the second doped region of the first conductive type is between 0.1 µm and 10 µm; and
wherein each of a width of each second doped region of the second conductive type and a width of each third doped region of the first conductive type is between 0.01 µm and 5 µm.

* * * * *